US 9,236,881 B2

(12) United States Patent
Pedersen et al.

(10) Patent No.: US 9,236,881 B2
(45) Date of Patent: Jan. 12, 2016

(54) COMPRESSION OF BITMAPS AND VALUES

(75) Inventors: Torben Bach Pedersen, Arhus N (DK); Francois Deliege, Brussels (BE)

(73) Assignee: Algorhyme A/S, Aalborg Øst (DK)

( * ) Notice: Subject to any disclaimer, the term of this patent is extended or adjusted under 35 U.S.C. 154(b) by 827 days.

(21) Appl. No.: 13/389,399

(22) PCT Filed: Jul. 29, 2010
(Under 37 CFR 1.47)

(86) PCT No.: PCT/DK2010/050199
§ 371 (c)(1),
(2), (4) Date: Sep. 20, 2012

(87) PCT Pub. No.: WO2011/015199
PCT Pub. Date: Feb. 10, 2011

(65) Prior Publication Data
US 2013/0018856 A1    Jan. 17, 2013

Related U.S. Application Data

(60) Provisional application No. 61/232,159, filed on Aug. 7, 2009.

(30) Foreign Application Priority Data

Aug. 7, 2009  (EP) .................................... 09167478

(51) Int. Cl.
*G06F 17/30*    (2006.01)
*H03M 7/30*    (2006.01)

(52) U.S. Cl.
CPC ............. *H03M 7/30* (2013.01); *G06F 17/3015* (2013.01)

(58) Field of Classification Search
CPC .................................................. G06F 17/3015
USPC ......... 707/792, 793, 795, 796, 802, 803, 812, 707/999.101; 341/50
See application file for complete search history.

(56) References Cited

U.S. PATENT DOCUMENTS

| 6,205,442 | B1  | 3/2001  | Cohen et al. |
| 6,831,575 | B2  | 12/2004 | Wu et al. |
| 2004/0090351 | A1 * | 5/2004 | Wu et al. .......................... 341/50 |

FOREIGN PATENT DOCUMENTS

| EP | 0650264 A1 | 4/1995 |
| EP | 1211611 A1 | 6/2002 |

OTHER PUBLICATIONS

O. Kaser, D. Lemire, K. Aouiche, "Histogram-Aware Sorting for Enhanced Word-Aligned Compression in Bitmap Indexes", Proceedings of the 11th ACM International Workshop on Data Warehousing and OLAP (DOLAP'08), pp. 1-8, Napa Valley, California, USA, dated Oct. 30, 2008; (8 pages).
J. Ziv, A. Lempel, "A Universal Algorithm for Sequential Data Compression", Transactions on Information Theory, IEEE, vol. 23, No. 3, pp. 337-343, dated 1997 (7 pages).
L.P. Deutsch, "Deflate Compressed Data Format Specification version 1.3", RFC 1951, IETF Network Working Group, dated May, 1996 (15 pages).
Deliege, F.; Pedersen, T.B: "Position List Word Aligned Hybrid: Optimizing Space and Performance for Compressed Bitmaps" EDBT '10 Proceedings of the 13th international Conference on Extending Database Technology. dated Mar. 22, 2010 (12 pages).

* cited by examiner

*Primary Examiner* — Syling Yen
(74) *Attorney, Agent, or Firm* — Nixon Peabody LLP

(57) ABSTRACT

The present invention relates to compression of values and bitmaps, and methods thereof. Such methods are configured for operating on a computer system having a word length architecture of length WL and are based on the observation that not all the bits used for the run-length counter—i.e., the fill length field (FL) inhere—are often used, since runs are seldom so long. Contrarily to other compression schemes (e.g., WAH), said methods may assign the unused bits to one or more position list fields (PL, $PL_1$, $PL_2$, $PL_s$), thus boosting the compression ratio. Moreover, the total length (in terms of number of bits) of the uncompressed data—comprising values or bitmaps—may be stored just once, preferably at the beginning of the compression, thus dramatically diminishing the storage requirements for the compression scheme, since it is not required to keep track of the length of each bitmap word while performing the compression or the decompression.

17 Claims, 8 Drawing Sheets

1

00000000001000000000 ... 000000000000000100000000000000000010000

2

```
                    WL - 1
            ┌─────────────────────┐
63  →  000000000000000000000000000000  ← DW

...

64  →  000000000000000000000000000000  ← DW
                                                    65
                    WL                            ↙
            ┌─────────────────────┐
66  →  10000000100000000000000000000000  ← MFW
                    └──────────────┘
                           FL
67  →  10000000100000000000000000000000  ← MFW
                    └──────────────┘
                           FL
```

FIG. 5

COMPRESSION OF BITMAPS AND VALUES

CROSS-REFERENCE TO RELATED APPLICATIONS

This application is a U.S. National Stage of International Application No. PCT/DK2010/050199, filed Jul. 29, 2010, which claims the benefit of European Patent Application No. 09167478.8, filed on Aug. 7, 2009, and U.S. Provisional Patent Application No. 61/232,159, filed on Aug. 7, 2009, all of which are incorporated herein by reference in their entireties.

FIELD OF THE INVENTION

The present invention generally relates to bitmap indexes; more particularly, to methods for compressing and decompressing bitmap indexes on a computer system, and to a data structure located in a computer-readable medium comprising such compressed bitmap indexes.

BACKGROUND OF THE INVENTION

Bitmap indexes are very efficient for queries; however, the size of the index dramatically increases for high-cardinality attributes if no compression scheme is employed. Compressed bitmap indexes are thus increasingly used to support efficient querying of large and complex databases. Examples of application areas include very large scientific databases and multimedia applications, where the datasets typically consist of feature sets with high dimensionality. Specialized databases storing large amounts of data (data warehouses), for instance, contain data that are analyzed with respect to various aspects, where the data are typically high-dimensional and range over very wide intervals. Compressed bitmap indexes enable efficient range queries over one dimension as well as combining several dimensions for multidimensional range queries.

US 2004/0090351 discloses the Word Aligned Hybrid (WAH) compression scheme, which is a lossless compression scheme based on run-length encoding, i.e., continuous sequences of bits are represented by one bit of the same value and the length of the sequence. WAH is currently regarded as the fastest and most CPU-efficient bitmap compression scheme. Basically, its performance gain is due to the enforced alignment with the CPU word size, which yields more CPU friendly bitwise operations between bitmaps. However, WAH suffers from a significant storage overhead and its compression ratios are less than optimal.

Hence, there is the need for a solution that overcomes the disadvantages of WAH, thus providing a compression scheme that outperforms WAH both performance- and storage-wise.

SUMMARY OF THE INVENTION

The present invention preferably seeks to alleviate or eliminate the above-mentioned disadvantages of low compression ratios and high storage requirements of WAH and other compression schemes. In particular, it may be seen as an object of the present invention to provide a compression scheme, which, on the one hand, provides high compression ratios and, on the other hand, requires low storage requirements.

This object and several other objects are obtained in a first aspect of the present invention by providing a method for compressing one or more values to a compressed bitmap, the method being configured for operating on a computer system having a word length architecture of length WL, the method comprising the steps of:

calculating a group number GN for each value by performing a first operation between each value and a number derived from WL, so as to determine to which group each value belongs to;

calculating a position number for each value by performing a second operation between each value and a number derived from WL;

if there is a group not containing values that precedes a group containing values, generating a zero-fill word of length WL by:
  appending a set flag bit to a zero-bitmap word;
  assigning to the zero-bitmap word a fill length field, composed by one or more bits; and
  assigning to the fill length field of the zero-bitmap word a value equal to one;

if there are groups not containing values that precede a group containing values, generating a merged zero-fill word of length WL by:
  appending a set flag bit to a zero-bitmap word;
  assigning to the zero-bitmap word a fill length field, composed by one or more bits; and
  assigning to the fill length field of the zero-bitmap word a value equal to the number of groups not containing values that precede the group containing values;

if there is a group containing WL−1 values, generating a one-fill word of length WL by:
  appending a set flag bit to a zero-bitmap word;
  assigning a set fill bit to the zero-bitmap word;
  assigning to the zero-bitmap word a fill length field, composed by one or more bits; and
  assigning to the fill length field of the zero-bitmap word a value equal to one;

if there is more than one group containing WL−1 values, generating a merged one-fill word of length WL by:
  appending a set flag bit to a zero-bitmap word;
  assigning a set fill bit to the zero-bitmap word;
  assigning to the zero-bitmap word a fill length field, composed by one or more bits; and
  assigning to the fill length field of the zero-bitmap word a value equal to the number of groups containing WL−1 values; and if the number of values contained in a group differs for a number less than or equal to a threshold s from the number of values contained in a preceding group, generating a position list word of length WL by:
  assigning one or more position list fields to one of the fill words or one of the merged fill words, each position list field being composed by one or more bits, wherein the number of position list fields corresponds to the number of values contained in the group; and
  assigning to the position list fields the position numbers associated to the values contained in the group.

The above method is based on the observation that not all the bits used for the run-length counter (i.e., the fill length field inhere) are often used, since runs are seldom so long. Contrarily to other compression schemes (e.g., the WAH compression scheme), the method of this invention may assign the unused bits to one or more position list fields, thus boosting the compression ratio.

It may be seen as an advantage that the compression method of the present invention enables word-by-word decompression in matching decompression schemes. Word-by-word decompression makes logical bitwise operations between bitmap words extremely fast. Basically, it is possible to decompress, perform logical operations and recompress word by word without the need for the uncompressed bitmap to be actually materialized, unlike, e.g., LZ-based bitmap compression (J. Ziv, A. Lempel, "A Universal Algorithm for Sequential Data Compression", Transactions on Information Theory, IEEE, vol. 23, no. 3, pp. 337-343, 1997).

Contrarily to other compression schemes (e.g., the WAH compression scheme), the total length (in terms of number of bits) of the uncompressed data—comprising values or bitmaps—need only to be stored once, preferably at the start of the storage used for the total bitmap index (consisting of many compressed bitmaps). This dramatically diminishes the storage requirements when dealing, for example, with large amounts of very short compressed bitmaps, since it is not required to keep track of the length of each bitmap word while performing the compression or the decompression.

In a useful embodiment, the method for compressing one or more values to a compressed bitmap further comprises the steps of:
  if the one or more values are associated to a group with group number GN equal to zero, or if the number of values contained in a group differs for a number more than a threshold s from the number of values contained in a preceding group, or if the preceding group has generated a position list word, generating a literal word of length WL by:
    appending an unset flag bit to a zero-bitmap word; and
    assigning set bits to the zero-bitmap word in the positions indicated by the position numbers associated to the values contained in the group; and
  if a group is preceded by a group that has generated a literal word, generating a literal word of length WL.

In a beneficial embodiment, the method for compressing one or more values to a compressed bitmap further comprises the steps of:
  if there are groups not containing values that precede a group containing values, generating two or more merged zero-fill words of length WL by:
    assigning to the two or more fill length fields of two or more zero-fill words a value such that the combination of the values of the two or more fill length fields is equal to the number of groups that have been merged; and
  if there are groups containing WL−1 values, generating two or more merged one-fill words each of length WL by:
    assigning to the two or more fill length fields of two or more one-fill words a value such that the combination of the values of the two or more fill length fields is equal to the number of groups that have been merged.

The above embodiment may be particularly advantageous when there are very long runs with groups not containing values or groups containing WL−1 values, since the fill length field in a merged fill word may not be enough to store the counter that represents such a huge number of runs. Hence, two or more merged fill words may be generated, wherein the counter may be split up among the fill length fields of said merged fill words. The advantage of this approach is that, instead of using always two or, more merged fill words, it adapts their generation on the base of the run length, thus reducing the storage requirements needed for the compression scheme.

In a second aspect, the present invention relates to a method for compressing a bitmap to a compressed bitmap, the method being configured for operating on a computer system having a word length architecture of length WL, the method comprising the steps of:
  dividing the bitmap into division words of length WL−1 bits;
  determining homogeneous division words, wherein all bits have the same binary state, and heterogeneous division words, wherein at least one of the bits has a different binary state with respect to the other bits;
  appending an unset flag bit to the determined heterogeneous division words to obtain literal words of length WL;
  merging contiguous identical homogeneous division words into a merged fill word of length WL by assigning to the merged fill word a fill length field, composed by one or more bits, and by assigning to the fill length field a value equal to the number of contiguous fill words that have been merged into the merged fill word, and by appending a set flag bit to the merged fill word; and
  if a number, equal to or less than a threshold s, of distinguishing bits at positions Pi of one of the merged fill words differs from bits at the same positions Pi of a contiguous literal word, merging the merged fill word with the literal word into a position list word by assigning one or more position list fields to the merged fill word, each position list field being composed by one or more bits, wherein the number of position list fields corresponds to the number of distinguishing bits, and by assigning to each position list field a value equal to the position Pi of the corresponding distinguishing bit in the literal word.

The present invention defined in the first and second aspects are equally applicable and advantageous to compress bitmaps as well as values, where bitmaps could be uncompressed or already compressed, for example, by another compression scheme. In particular, the notion of position list field and position list word is common for both methods.

The same advantages with respect to compression ratios and storage requirements as mentioned for the first aspect are also valid for the second aspect of the present invention.

In a valuable embodiment of the method for compressing a bitmap to a compressed bitmap, the position list field is assigned between the fill bit and the fill length field at the position of the least significant bits LBS; when one or more position list fields have already been assigned in the position list word, a new position list field is assigned between the fill bit and the last included position list field at the position of the least significant bits.

In an advantageous embodiment, the method for compressing a bitmap to a compressed bitmap further comprises the step of merging contiguous identical homogeneous division words into two or more merged fill words of length WL, wherein the number of contiguous homogeneous division words that have been merged is calculated by combining the fill length fields of the two or more merged fill words.

In a third aspect, the present invention relates to a bitmap compression data structure located in a computer-readable medium, which comprises a compressed bitmap representing sequentially corresponding bits in an uncompressed bitmap, said compressed bitmap comprising words having a length of WL bits, each of the words of the compressed bitmap having a flag bit, wherein:
  if the flag bit is set, the corresponding bits in the uncompressed bitmap have all the same binary state, and the compressed bitmap word further comprises a fill bit and a fill length field (FL), the fill length field being composed by one or more bits, and the compressed bitmap word represents a merged fill word that is a grouping of FL*(WL−1) homogeneous bits of the corresponding uncompressed bitmap, wherein a value of the fill bit indicates the binary state of the corresponding bits in the uncompressed bitmap and wherein a value of the fill length field indicates the number of homogeneous words that have been merged, where a homogeneous word is a grouping of WL−1 homogeneous bits of the corresponding uncompressed bitmap;

if the flag bit is unset, at least one of the corresponding bits in the uncompressed bitmap has a different binary state with respect to the other bits, and the compressed bitmap word represents a literal word that is a grouping of WL−1 heterogeneous bits of the corresponding uncompressed bitmap; and if one or more of the merged fill words have one or more position list fields, each position list field being composed by one or more bits, the compressed bitmap word represents a position list word that is a grouping of one of the merged fill words with one of the literal words, wherein the number of position list fields corresponds to the number of distinguishing bits at positions Pi of the literal word which differs from bits at the same positions Pi of the merged fill word and wherein the value of each position list field is the position of the corresponding distinguishing bit in the literal word.

Since such a data structure supports position list fields, the third aspect of the present invention advantageously enables higher compression rates and lower storage requirements, as explained for the first and second aspects.

In a useful embodiment of the bitmap compression data structure, two or more contiguous merged fill words represent a grouping of FL*(WL−1) homogeneous bits of the corresponding uncompressed bitmap, and wherein the fill length field (FL) is a combination of the values of the two or more fill length fields of the two or more contiguous merged fill words.

In a fourth aspect, the present invention relates to a method for reading a compressed bitmap, the method being configured for operating on a computer system having a word length architecture of length WL, the method comprising the steps of:

reading compressed bitmap words of length WL;

for each compressed bitmap word, determining if the compressed bitmap word is a literal word, wherein at least one of the corresponding bits in the uncompressed bitmap has a different binary state with respect to the other bits, by checking if a flag bit is unset;

determining if the compressed bitmap word is a merged fill word, that is a grouping of FL*(WL−1) homogeneous bits of the corresponding uncompressed bitmap, by checking the value of a fill length field and if a flag bit is set; and determining if the merged fill word is a position list word, having one or more position list fields, by checking if the value of at least one position list field is different from zero.

The fourth aspect of the present invention relates to reading of bitmaps being generated from compression of values or bitmaps according to the compression schemes of the first and second aspects. Thus, the fourth aspect advantageously enables reading of highly compressed bitmaps generated according to the first or second aspects. Moreover, such a reading method can be used for enabling the decompression from compressed bitmaps to values and bitmaps.

Contrarily to other compression schemes, e.g., ZIPDeflate (L. P. Deutsch, "DEFLATE Compressed Data Format Specification version 1.3", RFC 1951, IETF Network Working Group, May, 1996), one of the advantages of the fourth aspect is that the decompression can be performed word-by-word. Word-by-word decompression makes logical bitwise operations between bitmap words extremely fast. Basically, it is possible to decompress, perform logical operations and recompress word by word without the need for the uncompressed bitmap to be actually materialized, unlike, e.g., LZ-based bitmap compression (J. Ziv, A. Lempel, "A Universal Algorithm for Sequential Data Compression", Transactions on Information Theory, IEEE, vol. 23, no. 3, pp. 337-343, 1997).

Contrarily to other compression schemes (e.g., WAH), the total length (in terms of number of bits) of the uncompressed data—comprising values or bitmaps—need to be stored only once, preferably at the beginning of the compression. This dramatically diminishes the storage requirements when dealing, for example, with large amounts of very short compressed bitmaps, since it is not required to keep track of the length of each bitmap word while performing the compression or the decompression.

Contrarily to other compression schemes, e.g., LZ-based bitmap compression (J. Ziv, A. Lempel, "A Universal Algorithm for Sequential Data Compression", Transactions on Information Theory, IEEE, vol. 23, no. 3, pp. 337-343, 1997), one of the advantages of the present invention is that logical operations can be directly performed on the compressed bitmap words (during reading according to the fourth aspect) without the need of first decompressing them, thus achieving faster performance.

In a beneficial embodiment, the method for reading a compressed bitmap further comprises the steps of:

initializing a position counter (PC);

if the compressed bitmap word is a zero-merged fill word, increasing the position counter by FL*(WL−1);

if the compressed bitmap word is a one-merged fill word, generating values in the range from PC+FL to PC+(FL*(WL−1)) and increasing the position counter by FL*(WL−1);

if the compressed bitmap word is a literal word, generating values equal to PC summed with the positions of the set bits in the literal word and increasing the position counter by WL−1;

if the compressed bitmap word is a zero-merged fill word containing one or more position list fields, generating values equal to the position list fields and increasing the position counter by (FL+1)*(WL−1); and if the compressed bitmap word is a one-merged fill word containing one or more position list fields, generating values in the range from PC+FL to PC+(FL*(WL−1)) and values equal to the position list fields, and increasing the position counter by (FL+1)*(WL−1).

In a valuable embodiment of the method for reading a compressed bitmap, if there are two or more contiguous merged fill words, FL is obtained by combining the values of the two or more fill length fields of the two or more merged fill words.

In a beneficial embodiment, the method for reading a compressed bitmap further comprises the steps of:

if the compressed bitmap word is a literal word, grouping WL−1 bits of the literal word to generate the corresponding uncompressed bitmap word;

if the compressed bitmap word is a merged fill word, grouping FL*(WL−1) bits, whose binary state is given by the fill bit, to generate the corresponding uncompressed bitmap word; and if the value of the at least position list field is different from zero, generating WL−1 unset bits and assigning set bits at the positions indicated by the one or more position list fields to generate the corresponding uncompressed bitmap word.

In a valuable embodiment, the method for reading a compressed bitmap further comprises logically operating on the one or more compressed bitmap words as to create a resultant compressed bitmap word that is a function of a logical operator.

In a fifth aspect, the present invention relates to a system for compressing a bitmap or one or more values, the system comprising a computer system having a word length architecture of length WL and computing means for carrying out the method steps according to the first or the second aspect of the present invention.

In a sixth aspect, the present invention relates to a computer program for enabling a processor to carry out the method steps according the first or the second aspect of the present invention.

In a useful embodiment, the present invention relates to a signal carrying said computer program.

In a beneficial embodiment, the present invention relates to a tangible computer-readable medium having stored thereon said computer program.

The first to sixth aspect of the present invention may each be combined with any of the other aspects. These and other aspects of the present invention will be apparent from and elucidated with reference to the embodiments described hereinafter.

BRIEF DESCRIPTION OF THE DRAWINGS

Embodiments of the present invention will be described, by way of example only, with reference to the drawings, in which:

FIG. 5 shows an embodiment of a method for compressing a bitmap.

DESCRIPTION OF EMBODIMENTS

Embodiments of the present invention for compression of values or bitmaps are disclosed in the following.

Throughout this disclosure an immediately preceding group is considered as being the group with a group number GN equal to the group number of the current group minus 1, i.e. $GN_{(preceding\ group)} = GN_{(current\ group)} - 1$. The expressions 'preceding' and 'immediately preceding' are to be understood in the context of the groups being ordered by means of their group numbers GN.

Also throughout this disclosure the expression 'assigning to a field a value' or similar is to be understood as setting the bits composing the field to equal the binary representation of the value.

Figure 1:
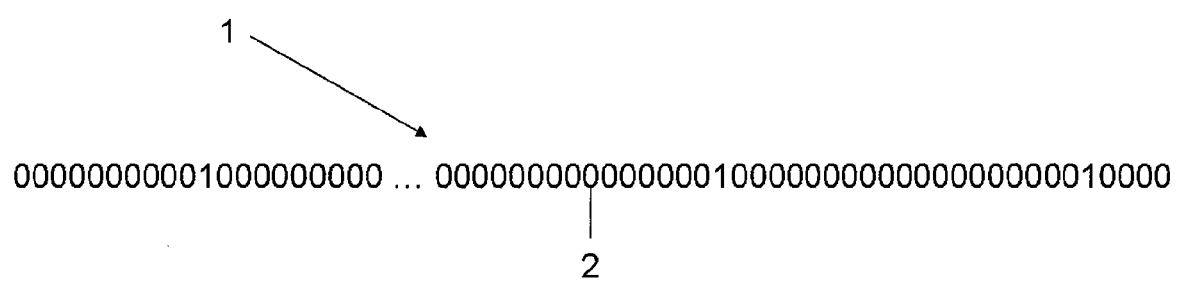
FIG. 1 shows a bitmap.

FIG. 1 shows a bitmap 1 comprising a number of bits 2. As used herein, the term "bitmap" refers to a spatially mapped array of bits, and the term "bit" refers to a binary digit, taking a logical value of either "1" or "0". Moreover, as used herein, the term "value" refers to a positive integer number, such as 100; nevertheless, whatever type of number, comprising negative numbers, rational numbers, irrational numbers and complex numbers could be considered.

Figure 2:
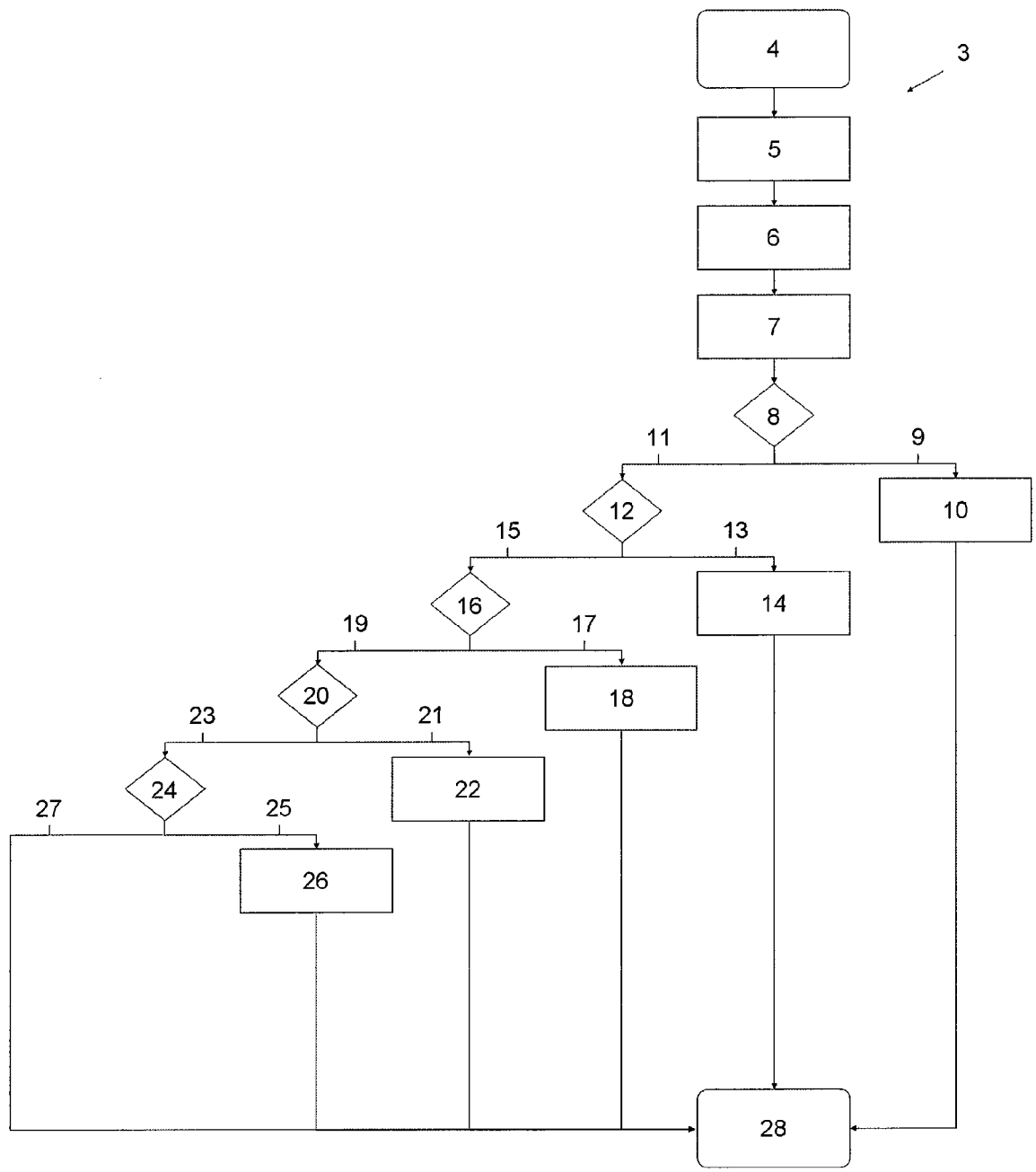
FIG. 2 shows a flow chart illustrating a method for compressing values to a compressed bitmap.

FIG. 2 illustrates a method for compressing one or more positive integer values to a compressed bitmap, where the method is configured for operating on a computer system having a word length architecture of length WL, meaning that such a computer system is designed to process data (also referred to as words) of length WL bits (e.g., 32 bits, 64 bits, etc.). Although a 64-bit CPU architecture is taken into consideration in FIG. 2, it has to be understood that the present invention applies to any CPU-architecture, e.g., having word lengths of 16-bits, 32-bits, and so on. In the following, a "set" bit is referred to as a bit whose value is "1" and to an "unset" bit as a bit whose value is "0"; however, nothing prevents the adoption of the opposite notation.

Compression is started in step 4.

The method for compressing one or more positive integer values to a compressed bitmap comprises a step 5 of sorting the one or more values, for example, in ascending or descending order. Let us assume to have the following set of values: 123, 189, 56, 74, 32, 81. After sorting those values in ascending order, the set will appear as: 32, 56, 74, 81, 123, 189.

The method for compressing one or more positive integer values to a compressed bitmap comprises an additional step 6 of calculating a group number GN in the range from zero to infinity for each value by performing a first operation between each value and a number derived from WL, so as to determine to which group each value belongs to. Such an operation may be dividing each value by WL−1, for example, where $$GN = \lfloor (\text{positive integer value} - 1)/(WL-1) \rfloor$$

The method for compressing one or more positive integer values to a compressed bitmap comprises an additional step 7 of calculating a position number PN in the range from 1 to WL−1 for each value by performing a second operation between each value and a number derived from WL, for example, where $$PN = ((\text{positive integer value} - 1 \bmod (WL1))) + 1$$

Steps 6 and 7 are such that an injective relation exists between the set of values and the set of couples (GN, PN), i.e. so that for each possible positive integer value a unique couple (GN, PN) exists.

If WL=64 and value=100, then GN=[99/63]=1 and PN=99 mod(63)+1=37.

If WL=32 and value=310, then GN=[309/31]=9 and PN=309 mod(31)+1=31.

Figure 3:
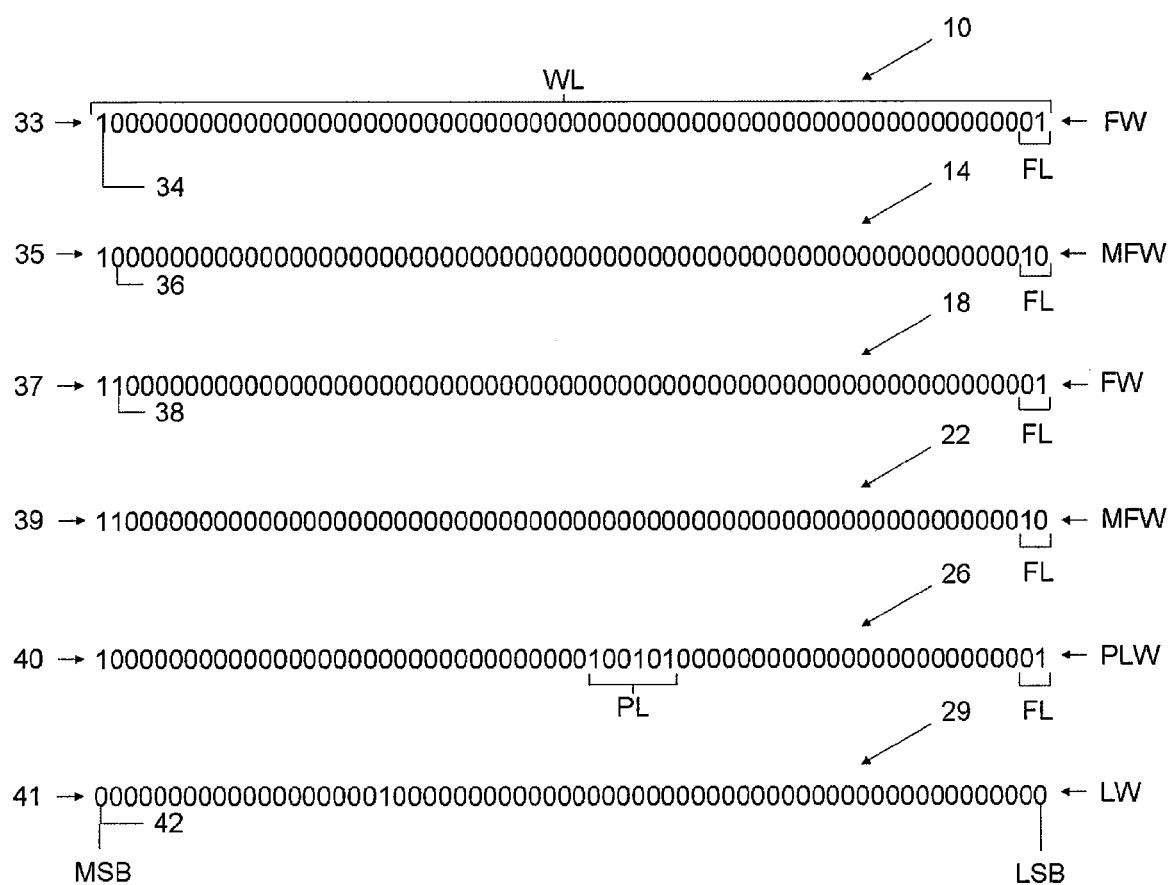
FIG. 3 shows examples of compressed bitmaps originated from values.

Determine 8 if there is a group not containing values that immediately precedes a group containing values:

If so 9, the method for compressing one or more values to a compressed bitmap comprises an additional step 10 of generating a zero-fill word FW, 33 (cf. FIG. 3) of length WL by, for example, creating a zero-bitmap word (i.e., a bitmap word consisting of only zeros) of length WL−1, appending a set flag bit 34 (cf. FIG. 3) to the zero-bitmap word, assigning to the zero-bitmap word a fill length field FL, composed by one or more bits, and assigning to the fill length field of the zero-bitmap word a value equal to one. As used herein, the terms "to assign a field" or "to assign a bit" refer to selecting one or more contiguous bits within a word and to setting or unsetting each of those bits. For instance, if value=100, then GP=1, which means that there is one value in group one and no values in group 0. As a consequence, a zero-fill word is built by, for example, creating a bitmap word of length 63 containing only zeros, and appending a set flag bit and assigning a fill length field with FL=1 (which in binary notation is "01") to the created bitmap word (cf. FIG. 3); and If not so 11, go to step 12.

Determine 12 if there are groups not containing values that immediately precede a group containing values:

If so 13, the method for compressing one or more values to a compressed bitmap comprises an additional step 14 of generating a merged zero-fill word MFW, 35 (cf. FIG. 3) of length WL by, for example, creating a zero-bitmap word of length WL−1, appending a set flag bit to the zero-bitmap word, assigning to the zero-bitmap word a fill length field, composed by one or more bits, and assigning to the fill length field of the zero-bitmap word a value equal to the number of groups not containing values that immediately precede the group containing values. For instance, if value=150, then GP=2, which means that there is one value in group two and no values in group 0 and group 1. As a consequence, a merged zero-fill word is built by, for example, creating a bitmap word of length 63 containing only zeros, and appending a set flag bit and assigning a fill length field with FL=2 (which in binary notation is "10") to the created bitmap word (cf. FIG. 3); and If not so 15, go to step 16.

The generation of a zero-fill or a merged zero-fill word may also be carried out in other ways than those previously described. For example, the zero-bitmap word could be of length WL instead of WL−1, and then the set flag bit will be assigned and not appended to the zero-bitmap word to generate a zero-fill word or a merged zero-fill word of length WL. Also, the zero-bitmap word could be of length WL−2 instead of WL−1, and then an unset fill bit 36 (cf. FIG. 3) will be appended to the zero-bitmap word as well as the set flag bit to generate a zero-fill word or a merged zero-fill word of length WL.

Determine 16 if there is a group containing WL−1 values:

If so 17, the method for compressing one or more values to a compressed bitmap comprises an additional step 18 of generating a one-fill word FW, 37 (cf. FIG. 3) of length WL by, for example, creating a zero-bitmap word of length WL−1, appending a set flag bit to the zero-bitmap word, assigning a set fill bit 38 (cf. FIG. 3) to the zero-bitmap word, assigning to the zero-bitmap word a fill length field, composed by one or more bits, and assigning to the fill length field of the zero-bitmap word a value equal to one. For instance, if we have a set of 63 values, e.g., 63, 64 . . . 125, then GP=1 for each of these values, which means that we have 63 values in group one and no values in group 0. As a consequence, a one-fill word is built by, for example, creating a bitmap word of length 63 containing only zeros, and appending a set flag bit, and assigning a set fill bit and a fill length field with FL=1 to the created bitmap word (cf. FIG. 3); and If not so 19, go to step 20.

Determine 20 if there is more than one group containing WL−1 values:

If so 21, the method for compressing one or more values to a compressed bitmap comprises an additional step 22 of generating a merged one-fill word MFW, 39 (cf. FIG. 3) of length WL by, for example, creating a zero-bitmap word of length WL−1, appending a set flag bit to the merged one-fill word, assigning an unset fill bit to the zero-bitmap word, assigning to the zero-bitmap word a fill length field, composed by one or more bits, and assigning to the fill length field of the zero-bitmap word a value equal to the number of groups containing WL−1 values. For instance, if we have a set of 63 values, e.g., 126, 127 . . . 188, then GP=2 for each of these values, which means that there are 63 values in group two and no values in group 0 and group 1. As a consequence, a merged one-fill word is built by, for example, creating a bitmap word of length 63 containing only zeros, and appending a set flag bit, and assigning a set fill bit and a fill length field with FL=2 to the created bitmap word (cf. FIG. 3); and If not so 23, go to step 24.

The generation of a one-fill or a merged one-fill word may also be carried out in other ways than those previously described. For example, the zero-bitmap word could be of length WL instead of WL−1, and then the unset flag bit will be assigned and not appended to the zero-bitmap word to generate a one-fill word or a merged one-fill word of length WL. Also, the zero-bitmap word could be of length WL−2 instead of WL−1, and then the set fill bit will be appended to the zero-bitmap word as well as the set flag bit to generate a one-fill word or a merged one-fill word of length WL.

In a useful embodiment, the flag bit 34, 42 is appended to a zero-bitmap word at the position of the most significant bit MSB by adding a bit in front of the zero-bitmap word.

In a beneficial embodiment, the fill bit 36, 38 in a merged fill word MFW, 35, 39 or in a fill word FW, 33, 37 is assigned at the position of the second most significant bit MSB.

In a valuable embodiment, the fill length field FL in a merged fill word MFW, 35, 39 or in a fill word FW, 33, 37 is assigned at the position of the least significant bits LSB.

Determine 24 if the number of values contained in a group differs for a number less than or equal to a threshold s from the number of values contained in the immediately preceding group containing 0 or WL−1 values:

If so 25, the method for compressing one to s values to a compressed bitmap comprises an additional step 26 of generating a position list word PLW, 40 (cf. FIG. 3) of length WL by assigning one to s position list fields PL to a fill word or a merged fill word (zero-fill as well as one-fill), each position list field being composed by one or more bits, wherein, if the immediately preceding group contains 0 value, the number of position list fields with a value different from 0 corresponds to the number of values contained in the group, or if the immediately preceding group contains exactly WL−1 values, the number of position list fields with a value different from 0 corresponds to WL−1 minus the number of values contained in the group. This method does not overwrite other words as the number of positions list fields PL within a fill word or a merged fill word is limited to a maximum threshold s. Moreover, the method step comprises assigning to the position list fields the position numbers associated to the values contained in the group. For instance, if s=5 and value=100, then GP=1, which means that there is one value in group one and no values in group 0. As a consequence, a position list word is built by inserting in a zero-fill word created by method step 10, one position list field, which is assigned the value PN=37 (cf. method step 7) that in binary notation is "100101" (cf. FIG. 3); and If not so 27, go to step 28.

Step 28; return to step 4 if there are still values to be compressed.

In an advantageous embodiment, if the one or more values are associated to a group with GN equal to zero, or if the number of values contained in a group differs for a number more than a threshold s from the number of values contained in a immediately preceding group, or if the immediately preceding group has generated a position list word PLW, 40, or if those values are associated to the first group, the method for compressing one or more values to a compressed bitmap further comprises a step 29 of generating a literal word LW, 41 (cf. FIG. 3) of length WL by, for example, creating a zero-bitmap word of length WL−1, appending an unset flag bit 42 (cf. FIG. 3) to the zero-bitmap word and assigning set bits to the zero-bitmap word in the positions indicated by the position numbers PN associated to the values contained in the group. Moreover, if a group is immediately preceded by a group that has generated a literal word, the method for compressing one or more values to a compressed bitmap comprises a further step of generating a literal word of length WL. For example, if value=20, then GP=0, which means that there is one value in group 0, which is the first group. As a consequence, a literal word is built by, for example, creating a bitmap word of length 63 containing only zeros, and appending an unset flag bit and assigning a set bit in the position indicated by the position number, PN=20, to the created bitmap word (cf. FIG. 3).

The generation of a literal word may also be carried out in other ways than that previously described, similarly to what is mentioned for fill words and merged fill words.

In a useful embodiment, if there are groups not containing values that immediately precede a group containing values, the method for compressing one or more values to a compressed bitmap further comprises a step of generating two or more merged zero-fill words MFW, 35 of length WL by assigning to the two or more fill length fields FL of the two or more zero-fill words FW, 33 a value such that the combination of the values of the two or more fill length fields is equal to the number of groups not containing values that immediately precede a group containing values. Additionally, if there are groups containing WL−1 values, the method for compressing one or more values to a compressed bitmap comprises a further step of generating two or more merged one-fill words MFW, 39 each of length WL by assigning to the two or more fill length fields of the two or more one-fill words FW, 37 a value such that the combination of the values of the two or more fill length fields is equal to the number of groups containing WL−1 values.

Examples of situations where the above embodiment may come into hand are when WL=32 and there are very long runs with no values in contiguous groups; therefore, one merged fill word may not suffice to contain in its fill length field a very long counter. Hence, two or more merged fill words may be generated, and the counter may be split up among all the generated merged fill words. Let us assume that the fill length field has a size of 25 bits in a bitmap word of length 32 bits. Then, the fill length field can store a counter having value FL=(2^25−1). If the number of contiguous groups with no values exceeds FL, we could generate two merged fill words, where, for example, the 25 least significant bits of the counter are stored in the fill length field of the first merged fill word, while the 25 most significant bits of the counter are stored in the fill length field of the second merged fill word.

The present invention may be also used to compress bitmaps instead of values, where bitmaps could be uncompressed or already compressed, for example, by another compression scheme. Hence, the following compression method for compression of bitmaps to compressed bitmaps is based on the same inventive features as the method for compression of values to compressed bitmaps.

Figure 4:
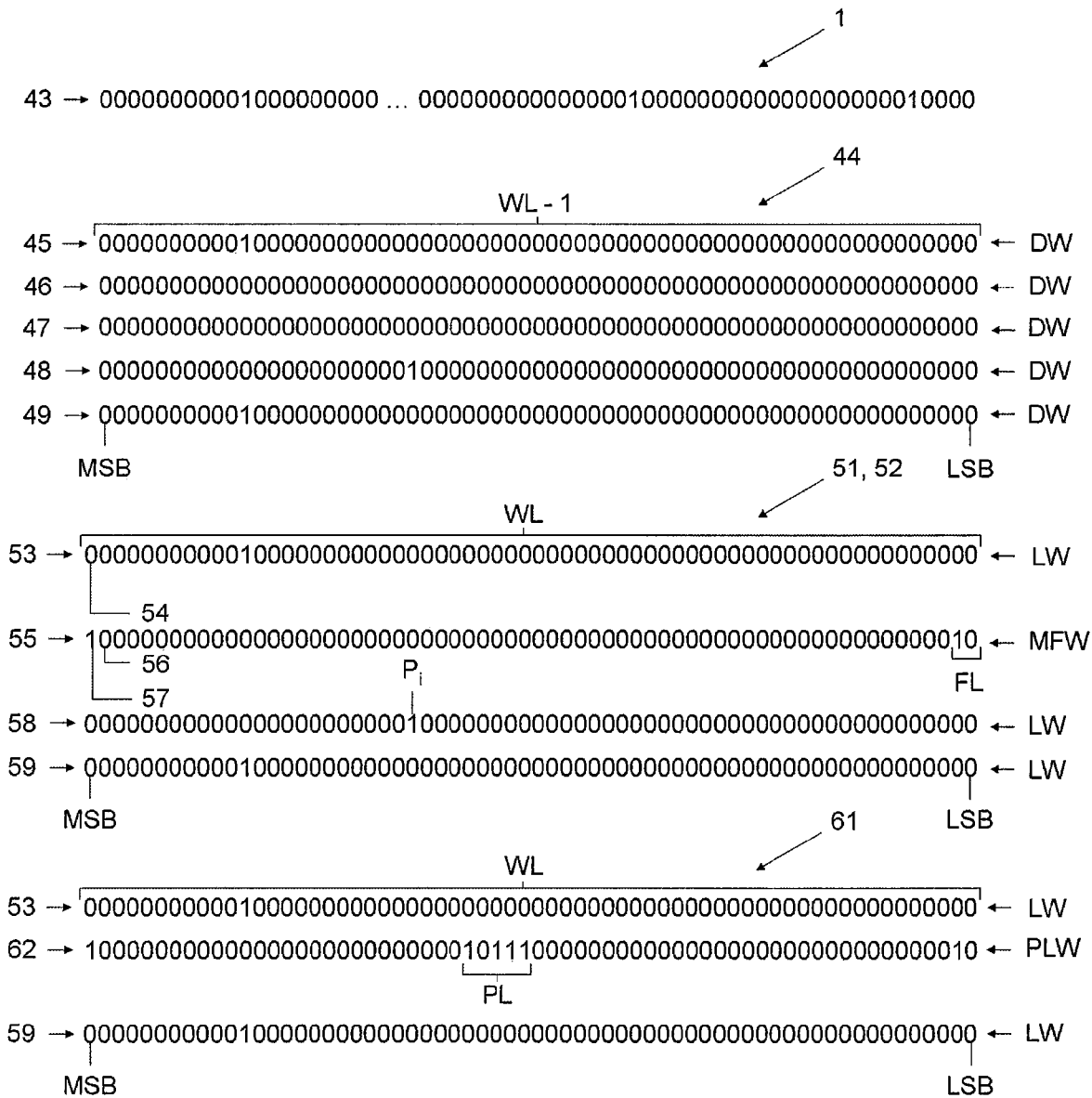
FIG. 4 shows a method for compressing a bitmap.

FIG. 4 illustrates a method for compressing a bitmap 1, 43 to a compressed bitmap, where the method is performed by a computer system having a word length architecture of length WL. In FIG. 4, it is assumed that the bitmap is composed of 267 bits and WL is 64.

The method for compressing a bitmap to a compressed bitmap comprises a step 44 of dividing the bitmap into words of equal bit length, which corresponds to the word length WL of the CPU architecture minus one bit (i.e., 63 in FIG. 4); the divided words are referred to as division words DW. FIG. 4 shows that the bitmap has been divided into five division words 45, 46, 47, 48, 49, each being 63 bits long.

In a beneficial embodiment, if the total length of the bitmap 1, 43 is not a multiple of WL−1, the last word is appended with 0 to WL−2 bits set to zero as needed to reach a length that is a multiple of WL−1.

The method for compressing a bitmap to a compressed bitmap comprises an additional step of determining division words composed either of homogeneous bits all being set or unset (i.e., wherein all bits have the same binary state) or heterogeneous bits (i.e., wherein at least one of the bits has a different binary state with respect to the other bits) by, for example, reading each division word from the most significant bit MSB to the least significant bit LSB and identifying whether all bits are set or unset. If all bits are not either set or unset, the method for compressing a bitmap comprises a further step 51 of appending an unset flag bit 54 to the determined division words (DW, 45, 48, 49 in FIG. 4) by adding a bit to the determined division words; such determined heterogeneous division words are referred to as literal words LW, 53, 58, 59. FIG. 4 shows three literal words, each being 64 bits long.

The method for compressing a bitmap comprises an additional step 52 of merging contiguous identical (all zeros or all ones) homogeneous division words. As used herein, the term "contiguous" refers to words that are adjacent. The merging may be done by keeping one of the contiguous identical homogeneous division words while deleting the other one. Alternatively, the merging may be done by generating a new homogeneous division word, where all the bits are unset (i.e., a zero-bitmap word), and deleting the contiguous identical homogeneous division words, which have been merged. In FIG. 4, the second example of merging is considered, where a fill length field FL, composed by one or more bits and a set flag bit 57 are assigned in the newly generated homogeneous division word. The value assigned to the fill length field indicates the number of contiguous identical homogeneous division words that have been merged; such newly generated homogeneous division words are referred to as merged fill words MFW, 55. In order to distinguish between merged fill words originated from division words containing only zeros or ones a fill bit may be assigned to the merged fill word. FIG. 4 shows a merged fill word, where the value of the fill length field is two ("10" in binary notation equals to "2" in decimal notation) and the value of the fill bit 56 is zero, thus indicating that two contiguous identical homogeneous division words DW, 46, 47 consisting of all zeros have been merged.

In a valuable embodiment, if a homogeneous division word is not contiguous to any other identical homogeneous division word, a set flag bit and a fill length field with value equal to one may be assigned to the homogeneous division word. In order to determine if the homogeneous division word is composed by all zeros or ones, the value of the second most significant bit may be checked. Alternatively, the homogeneous division word may be deleted and a new homogeneous division word, where all the bits are unset, may be generated. A flag bit, a fill bit, which indicates the binary state of the bits of the initial homogeneous division word, and a fill length field may be assigned in the newly generated homogeneous division word; such homogeneous division words are referred to as fill words FW.

In an advantageous embodiment, the flag bit 54, 57 is appended to a determined division word DW, 45, 46, 47, 48, 49 at the position of the most significant bit MSB by adding a bit in front of the determined division word.

In a useful embodiment, the fill bit 56 in a merged fill word MFW, 55 or in a fill word FW is assigned at the position of the second most significant bit MSB.

In a beneficial embodiment, the fill length field FL in a merged fill word MFW, 55 or in a fill word FW is assigned at the position of the least significant bits LSB.

The method for compressing a bitmap to a compressed bitmap comprises an additional step of determining if a number of distinguishing bits at positions Pi of one of the fill words or one of the merged fill words differs from bits at the same positions Pi of a contiguous literal word by, for example, comparing bit-by-bit one of the fill words or one of the merged fill words with a contiguous literal word; this comparison may be carried out either including or excluding the flag bit, the fill bit and the fill length field. If the number of distinguishing bits is equal to or less than a threshold s, the method further comprises a step 61 of merging the fill word or the merged fill word with the contiguous literal word by assigning one or more position list fields PL, each composed by one or more bits, to the fill word or the merged fill word and removing the literal word from the bitmap; such fill words or merged fill words are referred to as position list words PLW, 62. The number of assigned position list fields in a position list word corresponds to the number of distinguishing bits, while the value of each position list field represents the position Pi of the corresponding distinguishing bit in the literal word.

In a valuable embodiment, one of the fill words FW or one of the merged fill words MFW, 55 is only merged with one of the literal words LW, 53, 58, 59 if the literal word follows subsequently the fill word or the merged fill word.

In an advantageous embodiment, the fill bit 56 and the fill length field FL are placed in a position list word PLW, 62 at the positions of the second most significant bit MSB and the least significant bits LSB, respectively, and the position list field PL is assigned between the fill bit and the fill length field at the position of the least significant bits. When one or more position list fields have already been assigned in the position list word, a new position list field is assigned between the fill bit and the last included position list field at the position of the least significant bits.

In a useful embodiment, the maximum number of distinguishing bits Pi is defined by the threshold $$s = \left\lfloor \frac{l}{\log_2 w} \right\rfloor = \left\lfloor \frac{w-2-r}{\lceil \log_2 w \rceil} \right\rfloor \text{ wherein}$$

l is the number of bits in the position list field PL,
r is the number of bits in the fill length field FL, and
w is the total number of bits in a fill word FW or in a merged fill word MFW, 55
so that the total number of bits in a fill word is equal to:

$w=2+r+l$ and that the length for storing each Pi is $Pi=\lceil \log_2(w) \rceil$ so that $l-s*\lceil \log_2(w) \rceil$ s is a positive integer parameter that can vary between [0: max(s)], where $$\max(s) = \max\left(\frac{w-2}{\lceil \log_2 w \rceil}\right)$$

so that $\max(s)*\lceil \log_2(w) \rceil \leq w-2$

Consequently the maximum value for l is $\max(l)=\max(s)*\lceil \log_2(w) \rceil$, And the minimum value for r is $\min(r)=w-2-\max(l)$ Examples of threshold s are:
For WL=32, s can be picked between $$\left[0; \left\lfloor \frac{32-2}{5} \right\rfloor \right[ = [0; 6[$$

So, if s=1, $Pi=\log_2 32=5$, $l=1*5=5$, and $r=32-2-5=25$

For WL=64, s can be picked between $$\left[0; \left\lfloor \frac{64-2}{6} \right\rfloor \right[ = [0; 10[$$

So, if s=5, $Pi=\log_2 64=6$, $l=5*6=30$, and $r=64-2-30=32$

The number of bits r in the fill length field FL determines M, the maximum number of consecutive zero-fill or one-fill words that can respectively be merged into a zero-fill merged or a one-fill merged word.

$M=2^r-1$ $r=w-2-s*\lceil \log_2 w \rceil$

The threshold s is a parameter selected before the whole compression procedure is started and that is accordingly set up e.g. in the decoder or the data structure or in the algorithm so that the decoder is able to distinguish the different fields in the compressed words.

When there is not enough room available in the position list to store all the values in a merged fill word, the values are not stored in the merged fill word but by setting all the Pi to zero and creating a literal word after the fill word.

When the number N of consecutive zero-fill words or one-fill words that are to be compressed is larger than M, multiple merged fill words are used. The FL in the first MFW will represent the least significant bits of N. The FL in the following MFW will represent the next least significant bits of N until all bits of N can be represented. All these MFW will have their Pi set to zero, except the last one that will have its Pi set as it is the case when N is ≤M. When a merged fill word with all its position list bits set to zero is immediately followed by another fill word of the same type, the two fill words are to be read by means of combining the two field length fields using the method described above.

FIG. 4 shows a merged fill word, wherein 32 bits are used for the fill length field and 2 bits are used for the fill bit 56 and the flag bit 57. There are therefore 30 bits left, namely from the 3$^{rd}$ to the 32$^{nd}$ MSB, which can be used to assign one or more position list fields. In a 64 bits long position list word PLW, 62, a position list field requires 6 bits in order to ensure that all the possible positions of a distinguishing bit in a literal word can be captured. Hence, there is space for s=5 position list fields for storing a literal word in merged fill word. In FIG. 4, merged fill word MFW, 55 is followed by literal word LW, 58 with only one distinguishing bit Pi at position twenty three. Thus, the resulting position list word PLW, 62 is the merged fill word MFW, 55 to which a position list field with value "10111" ("10111" in binary notation equals to "23" in decimal notation) has been assigned.

FIG. 5 illustrates a method for compressing a bitmap 1, 43 to a compressed bitmap further comprising the step 65 of merging contiguous identical homogeneous division words DW, 63, 64 into two or more merged fill words MFW, 66, 67 of length WL, wherein the number of contiguous homogeneous division words that have been merged is calculated by grouping the fill length fields FL of the two or more merged fill words. This may happen when WL=32 bits and there are very long runs; therefore, one merged fill word may not suffice to contain in its fill length field a very long counter.

Hence, two or more merged fill words may be generated, and the counter may be split up among all the merged fill words. In FIG. 5, the 25 least significant bits of the counter are assigned in the fill length field of the first merged fill word MFW, 66, while the 25 most significant bits of the counter are assigned in the fill length field of the second merged fill word MFW, 67.

Figure 6:
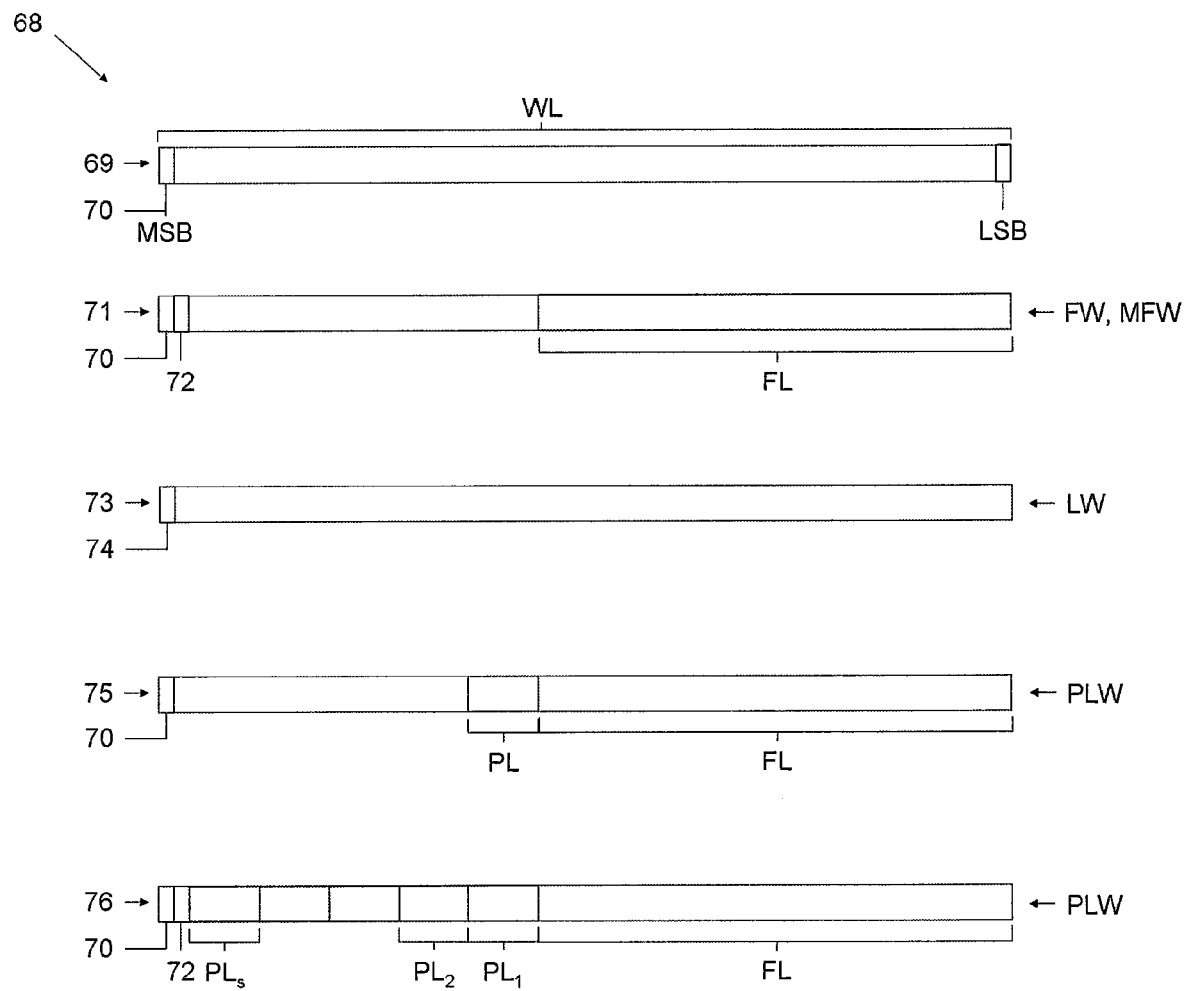
FIG. 6 shows a bitmap compression data structure.

FIG. 6 shows a bitmap compression data structure 68 of a compressed bitmap, which may be located in a computer-readable medium. The bitmap compression data structure comprises a compressed bitmap, which represents sequentially corresponding bits in an uncompressed bitmap 1, 43, and compressed bitmap words 69, 71, 73, 75, 76 having a length of WL bits. Such compressed bitmap words comprise a flag bit 70, 74.

If the flag bit is set 70, the corresponding bits in the uncompressed bitmap have all the same binary state, and the compressed bitmap word further comprises a fill bit 72 and a fill length field FL, the fill length field being composed by one or more bits. Such a compressed bitmap word represents a merged fill word MFW, 71, which is a grouping of FL*(WL−1) homogeneous bits all being set or unset of the corresponding uncompressed bitmap. Whereas a value of the fill bit indicates the binary state of the corresponding bits in the uncompressed bitmap, a value of the fill length field indicates the number of homogeneous words that have been merged, where a homogeneous word is a grouping of WL−1 homogeneous bits of the corresponding uncompressed bitmap.

In a beneficial embodiment, if the flag bit is set 70 and the value of the fill length field FL is equal to one such a word represents a fill word FW, 71 that is a grouping of WL−1 homogeneous bits (i.e., all zeros or all ones) of the corresponding uncompressed bitmap 1, 43. In order to distinguish between zero fill words and one fill words, the value of the fill bit 72 or the value of the second most significant bit MSB may be checked.

If the flag bit is unset 74, at least one of the corresponding bits in the uncompressed bitmap has a different binary state with respect to the other bits, and the compressed bitmap word represents a literal word LW, 73 that is a grouping of WL−1 heterogeneous bits of the corresponding uncompressed bitmap.

If one or more of the fill words or the merged fill words have one or more position list fields PL, each position list field being composed by one or more bits, the compressed bitmap word represents a position list word PLW, 75, 76 that is a grouping of one of the fill words or one of the merged fill words with one of the literal words. The number of position list fields corresponds to the number of distinguishing bits at positions Pi of the literal word which differs from bits at the same positions Pi of the fill word or merged fill word; the value of each position list field is the position of the corresponding distinguishing bit in the literal word.

In a valuable embodiment, the flag bit 70 in a bitmap compression data structure 68 is placed at the position of the most significant bit MSB.

In an advantageous embodiment, the fill bit 72 in a bitmap compression data structure 68 is placed at the position of the second most significant bit MSB.

In a useful embodiment, the fill length field FL in a bitmap compression data structure 68 is placed at the position of the least significant bits LSB.

In a beneficial embodiment, the fill bit 72 and the fill length field FL are placed in a position list word PLW, 75, 76 at the positions of the second most significant bit MSB and the least significant bits LSB, respectively, and the position list field PL is placed between the fill bit and the fill length field at the position of the least significant bits. When one or more position list fields are present in the position list word, the one or more position list fields are consecutively placed between the fill bit and the fill length field starting at the position of the least significant bits (cf. $PL_1$, $PL_2$, $PL_s$ in FIG. 6).

In a valuable embodiment, the bitmap compression data structure 68 comprises two or more contiguous merged fill words, which represent a grouping of FL*(WL−1) homogeneous bits of the corresponding uncompressed bitmap 1, 43, wherein FL is a combination of the values of the two or more fill length fields of the two or more contiguous merged fill words. As mentioned previously, this may happen when WL=32 bits and there are very long runs; therefore, one merged fill word may not suffice to contain in its fill length field a very long counter.

Figure 7:
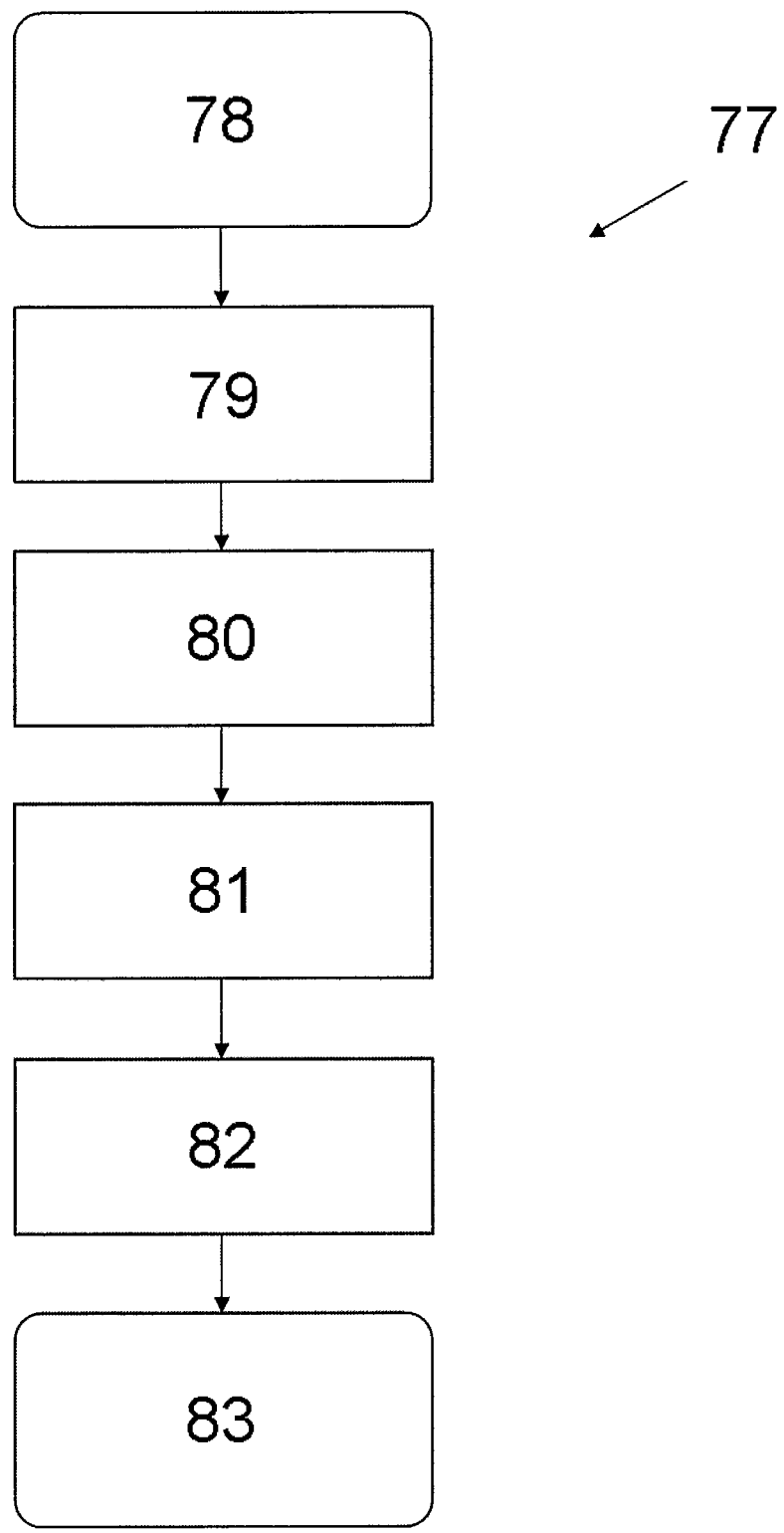
FIG. 7 shows a flow chart illustrating a method for decompressing a bitmap.

FIG. 7 illustrates a method for reading a compressed bitmap, where the method is configured for operating on a computer system having a word length architecture of length WL. The schematic implementation of the functioning of the method may comprise the following steps:

Reading is started in step 78.

Read 79 compressed bitmap words of length WL by, for example, starting from the most significant bit MSB to the least significant bit LSB.

For each compressed bitmap word, determine 80 if the compressed bitmap word is a literal word LW, 41, 53, 58, 59, 73, i.e., at least one of the corresponding bits in the uncompressed bitmap 1, 43 has a different binary state with respect to the other bits, by checking if a flag bit 34, 42, 54, 57, 70, 74 is unset.

For each compressed bitmap word, determine 81 if the compressed bitmap word is a merged fill word MFW, 35, 39, 55, 66, 67, 71 or a fill word FW, 33, 37, 71, i.e., a grouping of FL*(WL−1) homogeneous bits all being set or unset of the corresponding uncompressed bitmap, by checking the value of a fill length field FL and if a flag bit is set.

Determine 82 if the merged fill word or the fill word is a position list word PLW, 40. 62, 75, 76 having one or more position list fields PL, $PL_1$, $PL_2$, $PL_s$ by checking if the value of at least one position list field is different from zero.

Step 83; return to step 78 if there are still words to be uncompressed.

In an advantageous embodiment, the method for reading a compressed bitmap may be used for decompressing compressed bitmap words to values. The method may then further comprise the following steps:

Initialize a position counter PC by, for example, setting its value to zero.

If the compressed bitmap word is a zero-merged fill word MFW, 35, 55, 66, 67, increase the position counter by FL*(WL−1).

If the compressed bitmap word is a one-merged fill word MFW, 39, generating values in the range from PC+FL to PC+(FL*(WL−1)) and increase the position counter by FL*(WL−1).

In a useful embodiment, if there are two or more contiguous merged fill words MFW, 66, 67, FL is obtained by combining the values of the two or more fill length fields of the two or more merged fill words.

If the compressed bitmap word is a literal word LW, 41, 53, 58, 59, 73, generating values equal to PC summed with the positions of the set bits in the literal word and increasing the position counter by WL−1.

If the compressed bitmap word is a zero-merged fill word containing one or more position list fields (PL, $PL_1$, $PL_2$, $PL_s$), generating values equal to the position list fields and increasing the position counter by (FL+1)*(WL−1); and If the compressed bitmap word is a one-merged fill word containing one or more position list fields, generating values in the range from PC+FL to PC+(FL*(WL−1)) and excluding values corresponding to the position list fields, and increasing the position counter by (FL+1)*(WL−1).

In a beneficial embodiment, the method for reading a compressed bitmap may be used for decompressing compressed bitmap words to a bitmap 1, 43. The method may then further comprise the following steps:

Create a zero-bitmap word to store the resulting uncompressed words by, for example, allocating memory in the computer system as to accommodate the size of the resulting bitmap.

If the compressed bitmap word is a literal word LW, 41, 53, 58, 59, 73, group WL−1 bits of the literal word to generate the corresponding uncompressed bitmap word by, for example, appending the grouped bits to the zero-bitmap word. If the latter is not empty but already contains uncompressed words, the grouped bits may be appended subsequently to the last appended uncompressed word.

If the compressed bitmap word is a merged fill word MFW, 35, 39, 55, 66, 67, 71 or a fill word FW, 33, 37, 71, group fill length*(WL−1) bits, whose binary state is given by the fill bit 36, 38, 56, 72, to generate the corresponding uncompressed bitmap word by, for example, appending the grouped bits to the zero-bitmap word. If the latter is not empty but already contains uncompressed words, the grouped bits may be appended subsequently to the last appended uncompressed word.

If the merged fill word or the fill word is a position list word PLW, 40. 62, 75, 76, generate WL−1 unset bits and append them to the zero-bitmap word to generate the corresponding uncompressed bitmap word by assigning set bits at the positions indicated by the one or more position list fields PL, $PL_1$, $PL_2$, $PL_s$. If the zero-bitmap word is not empty but already contains uncompressed words, the grouped bits are appended subsequently to the last appended uncompressed word.

Contrarily to other compression schemes, e.g., ZIPDeflate (L. P. Deutsch, "DEFLATE Compressed Data Format Specification version 1.3", RFC 1951, IETF Network Working Group, May, 1996), one of the advantages of the present invention is that the decompression can be performed word-by-word. Word-by-word decompression makes logical bitwise operations between bitmap words extremely fast, as it requires very few conditional branches. Basically, it possible to decompress, perform logical operations and recompress word by word without the need for the uncompressed bitmap to be actually materialized, unlike, e.g., LZ-based bitmap compression (J. Ziv, A. Lempel, "A Universal Algorithm for Sequential Data Compression", Transactions on Information Theory, IEEE, vol. 23, no. 3, pp. 337-343, 1997).

Contrarily to other compression schemes (e.g., WAH), the total length (in terms of number of bits) of the uncompressed data—comprising values or bitmaps—may be stored just once, preferably at the beginning of the compression. This dramatically diminishes the storage requirements when dealing, for example, with large amounts of very short compressed bitmaps, since it is not required to keep track of the length of each bitmap word while performing the compression or the decompression.

In a valuable embodiment, the method for reading a compressed bitmap comprising logically operating on the one or more compressed bitmap words as to create a resultant compressed bitmap word that is a function of a logical operator. Said logical operator is selected from the group of logical operations consisting of the unary operator NOT, and the binary operators AND, NAND, OR, XOR, AND_NOT and OR_NOT.

Contrarily to other compression schemes, e.g., LZ-based bitmap compression (J. Ziv, A. Lempel, "A Universal Algorithm for Sequential Data Compression", Transactions on Information Theory, IEEE, vol. 23, no. 3, pp. 337-343, 1997), one of the advantages of the present invention is that logical operations can be directly performed on the compressed bitmap words without the need of first decompressing them, thus achieving faster performance.

Figure 8:
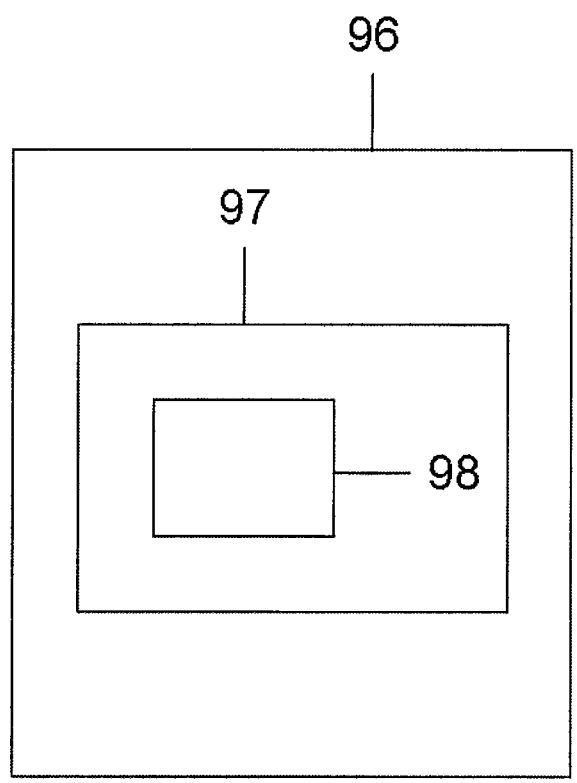
FIG. 8 shows a schematic illustration of a system for compressing a bitmap.

FIG. 8 shows a system 96 for compressing a bitmap, which comprises a computer system 97 having a word length architecture of length WL and computing means 98 for carrying out the method steps. An example of application of such a system may be mono- and multi-dimensional range queries in large multimedia database for music (Music Warehouses).

In an advantageous embodiment, the system 96 in FIG. 8 or an equivalent system may be used for decompressing a bitmap.

In a useful embodiment, the system 96 in FIG. 8 or an equivalent system may be used for both compressing and decompressing a bitmap.

The invention can be implemented in any suitable form including hardware, software, firmware or any combination of these. The invention or some features of the invention can be implemented as computer software running on one or more data processors and/or digital signal processors. The elements and components of an embodiment of the invention may be physically, functionally and logically implemented in any suitable way. Indeed, the functionality may be implemented in a single unit, in a plurality of units or as part of other functional units. As such, the invention may be implemented in a single unit, or may be physically and functionally distributed between different units and processors.

Aspects and embodiments of the invention further comprises:

A method for compressing one or more positive integer values (2) to a compressed bitmap using a computer system having a word length architecture of length WL, the method comprising the steps of:

calculating (6) a group number GN in the range from zero to infinity for each positive integer value by performing a first operation between each positive integer value and a number derived from WL, so as to determine to which group each positive integer value belongs to;

calculating (7) a position number PN in the range from 1 to WL−1 for each positive integer value by performing a second operation between each positive integer value and a number derived from WL, so as to determine the position of each value in each group, whereby an injective relation exists between the set of positive integer values and the set of couples GN, PN, that is for each possible positive integer value there exists a unique couple GN, PN;

if there is a group not containing positive integer values that immediately precedes a group containing positive integer values, generating (10) a zero-fill word FW (33) of length WL by:

appending a set flag bit (34) to a zero-bitmap word;

assigning to the zero-bitmap word a fill length field (FL), composed by one or more bits; and assigning to the fill length field of the zero-bitmap word a value equal to one;

if there are groups not containing positive integer values that immediately precede a group containing positive integer values, generating (14) a merged zero-fill word MFW (35) of length WL by:
   appending a set flag bit to a zero-bitmap word;
   assigning to the zero-bitmap word a fill length field, composed by one or more bits; and
   assigning to the fill length field of the zero-bitmap word a value equal to the number of groups not containing values that immediately precede the group containing positive integer values;
if there is a group containing WL−1 positive integer values, generating (18) a one-fill word FW (37) of length WL by:
   appending a set flag bit to a zero-bitmap word;
   assigning a set fill bit (38) to the zero-bitmap word;
   assigning to the zero-bitmap word a fill length field, composed by one or more bits; and
   assigning to the fill length field of the zero-bitmap word a value equal to one;
if there is more than one group containing WL−1 positive integer values, generating (22) a merged one-fill word MFW (39) of length WL by:
   appending a set flag bit to a zero-bitmap word;
   assigning a set fill bit to the zero-bitmap word;
   assigning to the zero-bitmap word a fill length field, composed by one or more bits; and
   assigning to the fill length field of the zero-bitmap word a value equal to the number of groups containing WL−1 positive integer values; and
if the number of values contained in a group differs for a number less than or equal to a threshold s from the number of values in a preceding group containing 0 or WL−1 values, generating a position list word of length W by:
   assigning one or more position list fields to one of the fill words or one of the merged fill words, each position list field being composed by one of more bits, wherein the number of position list fields different from zero corresponds to either the number of values in the preceding group and the number of values in the current group; and
   assigning to the position list fields the position numbers associated to the values missing or in excess to respectively form a group of WL−1 or 0 values as in the preceding group; and
if the one or more positive integer values are associated to a group with GN equal to zero, or if the number of positive integer values contained in a group differs for a number more than a threshold s from the number of positive integer values contained in a immediately preceding group, or if the immediately preceding group has generated a position list word, generating (29) a literal word LW (41) of length WL by:
   appending an unset flag bit (42) to a zero-bitmap word; and
   assigning set bits to the zero-bitmap word in the positions indicated by the position numbers PN associated to the positive integer values contained in the group; and
if a group that does not contain 0 or WL−1 values is immediately preceded by a group that has generated a literal word, generating a literal word of length WL; and
if there are groups not containing positive integer values that immediately precede a group containing positive integer values, generating two or more merged zero-fill words MFW (35) of length WL by:
   assigning to the two or more fill length fields FL of two or more zero-fill words FW (33) a value such that the combination of the positive integer values of the two or more fill length fields is equal to the number of groups that have been merged; and
if there are groups containing WL−1 positive integer values, generating two or more merged one-fill words MFW (39) each of length WL by:
   assigning to the two or more fill length fields of two or more one-fill words FW (37) a value such that the combination of the values of the two or more fill length fields is equal to the number of groups that have been merged.

2) A method for compressing a bitmap (1, 43) to a compressed bitmap, the method being configured for operating on a computer system having a word length architecture of length WL, the method comprising the steps of:
   appending the last word of the bitmap with 0 to WL−2 bits set to zero as needed so that the total length of the bitmap reaches a length that is a multiple of WL−1.
   dividing (44) the bitmap into division words (DW, 45, 46, 47, 48, 49) of length WL−1 bits;
   determining homogeneous division words (DW, 46, 47), wherein all bits have the same binary state, and heterogeneous division words (DW, 45, 48, 49), wherein at least one of the bits has a different binary state with respect to the other bits;
   appending (51) an unset flag bit (54) to the determined heterogeneous division words to obtain literal words (LW, 53, 58, 59) of length WL;
   merging (52) contiguous identical homogeneous division words into a merged fill word MFW (55) of length WL by assigning to the merged fill word a fill length field (FL), composed by one or more bits, and by assigning to the fill length field a value equal to the number of contiguous fill words that have been merged into the merged fill word, and by assigning a set flag bit (57) to the merged fill word, and assigning to the fill bit (56) a set bit in case the bits of the division word are all set and assigning to the fill bit an unset bit in case the bits of the division word are all unset; and
   if a number, equal to or less than a threshold s, of distinguishing bits at positions (Pi) of one of the merged fill words differs from bits at the same positions (Pi) of a contiguous literal word, merging (61) the merged fill word with the literal word into a position list word (PLW, 62) by assigning one or more position list fields (PL) to the merged fill word, each position list field being composed by one or more bits, wherein the number of position list fields corresponds to the number of distinguishing bits, and by assigning to each position list field a value equal to the position (Pi) of the corresponding distinguishing bit in the literal word.

3) A method for compressing a bitmap (1, 43) to a compressed bitmap according to 2), wherein the position list field (PL) is assigned between the fill bit (56) and the fill length field (FL) at the position of the least significant bits LBS; when one or more position list fields have already been assigned in the position list word (PLW, 62), a new position list field is assigned between the fill bit and the last included position list field at the position of the least significant bits.

4) A method for compressing a bitmap (1, 43) to a compressed bitmap according to claim 2) further comprising the step (65) of merging contiguous identical homogeneous division words (DW, 63, 64) into two or more merged fill words (MFW, 66, 67) of length WL, wherein the number of contiguous homogeneous division words that have been merged is calculated by combining the fill length fields (FL) of the two or more merged fill words.

5) A computer-readable medium which comprises a compressed bitmap representing sequentially corresponding bits in an uncompressed bitmap (1, 43), said compressed bitmap comprising words (69, 71, 73, 74, 75, 76) having a length of WL bits, each of the words of the compressed bitmap having a flag bit (70, 74), wherein:
  if the flag bit is set, the corresponding bits in the uncompressed bitmap have all the same binary state, and the compressed bitmap word further comprises a fill bit (72) and a fill length field (FL), the fill length field being composed by one or more bits, and the compressed bitmap word represents a merged fill word (MFW, 71) that is a grouping of FL*(WL−1) homogeneous bits all being set or unset of the corresponding uncompressed bitmap, wherein a value of the fill bit indicates the binary state of the corresponding bits in the uncompressed bitmap and wherein a value of the fill length field indicates the number of homogeneous words that have been merged, where a homogeneous word is a grouping of WL−1 homogeneous bits all being set or unset of the corresponding uncompressed bitmap;
  if the flag bit is unset, at least one of the corresponding bits in the uncompressed bitmap has a different binary state with respect to the other bits, and the compressed bitmap word represents a literal word (LW, 73) that is a grouping of WL−1 heterogeneous bits of the corresponding uncompressed bitmap; and
  if one or more of the merged fill words have one or more position list fields (PL, $PL_1$, $PL_2$, $PL_5$), each position list field being composed by one or more bits, the compressed bitmap word represents a position list word (PLW, 75, 76) that is a grouping of one of the merged fill words with one of the literal words, wherein the number of position list fields corresponds to the number of distinguishing bits at positions (Pi) of the literal word which differs from bits at the same positions (Pi) of the merged fill word and wherein the value of each position list field is the position of the corresponding distinguishing bit in the literal word.

6) The computer-readable medium according to 5), wherein two or more contiguous merged fill words represent a grouping of FL*(WL−1) homogeneous bits all being set or unset of the corresponding uncompressed bitmap, and wherein FL is a combination of the values of the two or more fill length fields of the two or more contiguous merged fill words.

7) A method for reading a compressed bitmap, the method being configured for operating on a computer system having a word length architecture of length WL, the method comprising the steps of:
  reading (79) compressed bitmap words of length WL;
  for each compressed bitmap word, determining (80) if the compressed bitmap word is a literal word (LW, 41, 53, 58, 59, 73), wherein at least one of the corresponding bits in the uncompressed bitmap has a different binary state with respect to the other bits, by checking if a flag bit (34, 42, 54, 57, 70, 74) is unset;
  determining (81) if the compressed bitmap word is a merged fill word (MFW, 35, 39, 55, 66, 67, 71), that is a grouping of FL*(WL−1) homogeneous bits all being set or unset of the corresponding uncompressed bitmap, by checking the value of a fill length field (FL) and if a flag bit is set; and
  determining (82) if the merged fill word is a position list word (PLW, 40, 62, 75, 76), having one or more position list fields (PL, $PL_1$, $PL_2$, $PL_s$), by checking if the value of at least one position list field is different from zero.

8) A method for reading a compressed bitmap according to 7) the method further comprising the steps of:
  initializing a position counter (PC);
  if the compressed bitmap word is a zero-merged fill word (MFW, 35, 55, 66, 67), increasing the position counter by FL*(WL−1);
  if the compressed bitmap word is a one-merged fill word (MFW, 39), generating values in the range from PC+FL to PC+(FL*(WL−1)) and increasing the position counter by FL*(WL−1);
  if the compressed bitmap word is a literal word (LW, 41, 53, 58, 59, 73), generating values equal to PC summed with the positions of the set bits in the literal word and increasing the position counter by WL−1;
  if the compressed bitmap word is a zero-merged fill word containing one or more position list fields (PL, $PL_1$, $PL_2$, $PL_s$), generating values equal to the position list fields and increasing the position counter by (FL+1)*(WL−1); and
  if the compressed bitmap word is a one-merged fill word containing one or more position list fields, generating values in the range from PC+FL to PC+(FL*(WL−1)) and excluding values corresponding to the position list fields, and increasing the position counter by (FL+1)*(WL−1).

9) A method for reading a compressed bitmap according to 8) wherein, if there are two or more contiguous merged fill words, (FL) is obtained by combining the values of the two or more fill length fields of the two or more merged fill words.

10) A method for reading a compressed bitmap (1, 10) according to 9), the method further comprising the steps of:
  if the compressed bitmap word is a literal word (LW, 41, 53, 58, 59, 73), grouping WL−1 bits of the literal word to generate the corresponding uncompressed bitmap word (1, 43);
  if the compressed bitmap word is a merged fill word (MFW, 35, 39, 55, 66, 67, 71), grouping FL*(WL−1) bits, whose binary state is given by the fill bit (36, 38, 56, 72), to generate the corresponding uncompressed bitmap word; and
  if the value of at least one position list field (PL, $PL_1$, $PL_2$, $PL_s$) is different from zero, generating WL−1 bits, whose binary state is given by the fill bit (36, 38, 56, 72), and assigning bits in the opposing state at the positions indicated by the one or more position list fields to generate the corresponding uncompressed bitmap word.

Although the present invention has been described in connection with the specified embodiments, it is not intended to be limited to the specific form set forth herein.

Rather, the scope of the present invention is limited only by the accompanying claims. In the claims, the term "comprising" does not exclude the presence of other elements or steps. Additionally, although individual features may be included in different claims, these may possibly be advantageously combined, and the inclusion in different claims does not imply that a combination of features is not feasible and/or advantageous. In addition, singular references do not exclude a plurality. Thus, references to "a", "an", "first", "second", etc. do not preclude a plurality. Furthermore, reference signs in the claims shall not be construed as limiting the scope.

The invention claimed is:

1. A method for compressing one or more values to a compressed bitmap, the method being configured for operating on a computer system having a word length architecture of length WL, a processor and a memory, the method comprising the steps of:

receiving a command from the processor to store one or more values in the memory;

calculating a group number (GN) for each value by performing a first operation between each value and a number derived from WL, so as to determine to which group each value belongs to;

calculating a position number (PN) for each value by performing a second operation between each value and a number derived from WL;

if there is a group not containing values that precedes a group containing values, generating a zero-fill word (FW) of length WL by:
  appending a set flag bit to a zero-bitmap word;
  assigning to the zero-bitmap word a fill length field (FL), composed by one or more bits; and
  assigning to the fill length field of the zero-bitmap word a value equal to one;

if there are groups not containing values that precede a group containing values, generating a merged zero-fill word (MFW) of length WL by:
  appending a set flag bit to a zero-bitmap word;
  assigning to the zero-bitmap word a fill length field, composed by one or more bits; and
  assigning to the fill length field of the zero-bitmap word a value equal to the number of groups not containing values that precede the group containing values;

if there is a group containing WL−1 values, generating a one-fill word (FW) of length WL by:
  appending a set flag bit to a zero-bitmap word;
  assigning a set fill bit to the zero-bitmap word;
  assigning to the zero-bitmap word a fill length field, composed by one or more bits; and
  assigning to the fill length field of the zero-bitmap word a value equal to one;

if there is more than one group containing WL−1 values, generating a merged one-fill word (MFW) of length WL by:
  appending a set flag bit to a zero-bitmap word;
  assigning a set fill bit to the zero-bitmap word;
  assigning to the zero-bitmap word a fill length field, composed by one or more bits; and
  assigning to the fill length field of the zero-bitmap word a value equal to the number of groups containing WL−1 values;

if the number of values contained in a group differs for a number less than or equal to a threshold s from the number of values contained in a preceding group, generating a position list word (PLW) of length WL by:
  assigning one or more position list fields (PL) to one of the fill words or one of the merged fill words, each position list field being composed by one or more bits, wherein the number of position list fields corresponds to the number of values contained in the group; and
  assigning to the position list fields the position numbers associated to the values contained in the group; and
storing the generated word corresponding to the one or more values in the memory.

2. A method for compressing one or more values to a compressed bitmap according to claim 1, the method further comprising the steps of:

if the one or more values are associated to a group with group number (GN) equal to zero, or if the number of values contained in a group differs for a number more than a threshold s from the number of values contained in a preceding group, or if the preceding group has generated a position list word, generating a literal word (LW) of length WL by:
  appending an unset flag bit to a zero-bitmap word; and
  assigning set bits to the zero-bitmap word in the positions indicated by the position numbers (PN) associated to the values contained in the group; and
if a group is preceded by a group that has generated a literal word, generating a literal word of length WL.

3. A method for compressing one or more values to a compressed bitmap according to claim 1, the method further comprising the steps of:

if there are groups not containing values that precede a group containing values, generating two or more merged zero-fill words (MFW) of length WL by:
  assigning to the two or more fill length fields (FL) of two or more zero-fill words (FW) a value such that the combination of the values of the two or more fill length fields is equal to the number of groups that have been merged; and
if there are groups containing WL−1 values, generating two or more merged one-fill words (MFW) each of length WL by:
  assigning to the two or more fill length fields of two or more one-fill words (FW) a value such that the combination of the values of the two or more fill length fields is equal to the number of groups that have been merged.

4. A method for compressing a bitmap to a compressed bitmap, the method being configured for operating on a computer system having a word length architecture of length WL a processor and a memory, the method comprising the steps of:

receiving a command from the processor to store one or more values in the memory;

dividing the bitmap into division words (DW) of length WL−1 bits;

determining homogeneous division words (DW), wherein all bits have the same binary state, and heterogeneous division words (DW), wherein at least one of the bits has a different binary state with respect to the other bits;

appending an unset flag bit to the determined heterogeneous division words to obtain literal words (LW) of length WL;

merging contiguous identical homogeneous division words into a merged fill word (MFW) of length WL by assigning to the merged fill word a fill length field (FL), composed by one or more bits, and by assigning to the fill length field a value equal to the number of contiguous fill words that have been merged into the merged fill word, and by appending a set flag bit to the merged fill word;

if a number, equal to or less than a threshold s, of distinguishing bits at positions (Pi) of one of the merged fill words differs from bits at the same positions (Pi) of a contiguous literal word, merging the merged fill word with the literal word into a position list word (PLW) by assigning one or more position list fields (PL) to the merged fill word, each position list field being composed by one or more bits, wherein the number of position list fields corresponds to the number of distinguishing bits, and by assigning to each position list field a value equal to the position (Pi) of the corresponding distinguishing bit in the literal word; and storing the word corresponding to the one or more values in the memory.

5. A method for compressing a bitmap to a compressed bitmap according to claim 4, wherein the position list field (PL) is assigned between the fill bit and the fill length field (FL) at the position of the least significant bits LBS; when one or more position list fields have already been assigned in the position list word (PLW), a new position list field is assigned between the fill bit and the last included position list field at the position of the least significant bits.

6. A method for compressing a bitmap to a compressed bitmap according to claim 4 further comprising the step of merging contiguous identical homogeneous division words (DW) into two or more merged fill words (MFW) of length WL, wherein the number of contiguous homogeneous division words that have been merged is calculated by combining the fill length fields (FL) of the two or more merged fill words.

7. A computer system including a processor and a non-transitory, computer-readable medium storing a bitmap compression data structure, which comprises a compressed bitmap representing sequentially corresponding bits in an uncompressed bitmap, said compressed bitmap comprising words having a length of WL bits, each of the words of the compressed bitmap having a flag bit, wherein:
  if the flag bit is set, the corresponding bits in the uncompressed bitmap have all the same binary state, and the compressed bitmap word further comprises a fill bit and a fill length field (FL), the fill length field being composed by one or more bits, and the compressed bitmap word represents a merged fill word (MFW) that is a grouping of FL*(WL−1) homogeneous bits of the corresponding uncompressed bitmap, wherein a value of the fill bit indicates the binary state of the corresponding bits in the uncompressed bitmap and wherein a value of the fill length field indicates the number of homogeneous words that have been merged, where a homogeneous word is a grouping of WL−1 homogeneous bits of the corresponding uncompressed bitmap;
  if the flag bit is unset, at least one of the corresponding bits in the uncompressed bitmap has a different binary state with respect to the other bits, and the compressed bitmap word represents a literal word (LW) that is a grouping of WL−1 heterogeneous bits of the corresponding uncompressed bitmap; and
  if one or more of the merged fill words have one or more position list fields (PL, $PL_1$, $PL_2$, $PL_s$), each position list field being composed by one or more bits, the compressed bitmap word represents a position list word (PLW) that is a grouping of one of the merged fill words with one of the literal words, wherein the number of position list fields corresponds to the number of distinguishing bits at positions (Pi) of the literal word which differs from bits at the same positions (Pi) of the merged fill word and wherein the value of each position list field is the position of the corresponding distinguishing bit in the literal word.

8. The computer system of claim 7, wherein two or more contiguous merged fill words represent a grouping of FL*(WL−1) homogeneous bits of the corresponding uncompressed bitmap, and wherein (FL) is a combination of the values of the two or more fill length fields of the two or more contiguous merged fill words.

9. A method for reading a compressed bitmap, the method being configured for operating on a computer system having a word length architecture of length WL, the computer system including a processor and a memory, the method comprising the steps of:
  reading compressed bitmap words of length WL from the memory;
  for each compressed bitmap word, determining if the compressed bitmap word is a literal word (LW), wherein at least one of the corresponding bits in the uncompressed bitmap has a different binary state with respect to the other bits, by checking if a flag bit is unset;
  determining if the compressed bitmap word is a merged fill word (MFW), that is a grouping of FL*(WL−1) homogeneous bits of the corresponding uncompressed bitmap, by checking the value of a fill length field (FL) and if a flag bit is set;
  determining if the merged fill word is a position list word (PLW), having one or more position list fields (PL, $PL_1$, $PL_2$, $PL_s$), by checking if the value of at least one position list field is different from zero; and
  decompressing the compressed bitmap words from the memory for access by the processor.

10. A method for reading a compressed bitmap according to claim 9, the method further comprising the steps of:
  initializing a position counter (PC);
  if the compressed bitmap word is a zero-merged fill word (MFW), increasing the position counter by FL*(WL−1);
  if the compressed bitmap word is a one-merged fill word (MFW), generating values in the range from PC+FL to PC+(FL*(WL−1)) and increasing the position counter by FL*(WL−1);
  if the compressed bitmap word is a literal word (LW), generating values equal to PC summed with the positions of the set bits in the literal word and increasing the position counter by WL−1;
  if the compressed bitmap word is a zero-merged fill word containing one or more position list fields (PL, $PL_1$, $PL_2$, $PL_s$), generating values equal to the position list fields and increasing the position counter by (FL+1)*(WL−1); and
  if the compressed bitmap word is a one-merged fill word containing one or more position list fields, generating values in the range from PC+FL to PC+(FL*(WL−1)) and values equal to the position list fields, and increasing the position counter by (FL+1)*(WL−1).

11. A method for reading a compressed bitmap according to claim 10, wherein, if there are two or more contiguous merged fill words, (FL) is obtained by combining the values of the two or more fill length fields of the two or more merged fill words.

12. A method for reading a compressed bitmap according to claim 9, the method further comprising the steps of:
  if the compressed bitmap word is a literal word (LW), grouping WL−1 bits of the literal word to generate the corresponding uncompressed bitmap word;
  if the compressed bitmap word is a merged fill word (MFW), grouping FL*(WL−1) bits, whose binary state is given by the fill bit, to generate the corresponding uncompressed bitmap word; and
  if the value of the at least position list field (PL, $PL_1$, $PL_2$, $PL_s$) is different from zero, generating WL−1 unset bits and assigning set bits at the positions indicated by the one or more position list fields to generate the corresponding uncompressed bitmap word.

13. A method for reading a compressed bitmap according to claim 9, the method further comprising logically operating on the one or more compressed bitmap words as to create a resultant compressed bitmap word that is a function of a logical operator.

14. A system for compressing a bitmap or one or more values, the system comprising a computer system having a word length architecture of length WL and computing means for carrying out the method steps according to claim 1.

15. A system for compressing a bitmap or one or more values, the system comprising a computer system having a word length architecture of length WL and computing means for carrying out the method steps according to claim 4.

16. A non-transitory physical computer-readable storage medium including instructions for enabling a processor to carry out the method steps according to claim 1.

17. A non-transitory physical computer-readable storage medium including instructions for enabling a processor to carry out the method step according to claim 4.

* * * * *